(12) United States Patent  
Koo

(10) Patent No.: US 8,582,362 B2  
(45) Date of Patent: Nov. 12, 2013

(54) CIRCUIT FOR PRECHARGING BIT LINE AND NONVOLATILE MEMORY DEVICE INCLUDING THE SAME

(75) Inventor: Cheul Hee Koo, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 445 days.

(21) Appl. No.: 12/650,907

(22) Filed: Dec. 31, 2009

(65) Prior Publication Data

US 2010/0302867 A1    Dec. 2, 2010

(30) Foreign Application Priority Data

May 29, 2009  (KR) .................. 10-2009-0047822

(51) Int. Cl.
*G11C 11/34* (2006.01)

(52) U.S. Cl.
USPC .................. 365/185.12; 365/189.09

(58) Field of Classification Search
USPC ........................ 365/185.12, 189.09
See application file for complete search history.

(56) References Cited

U.S. PATENT DOCUMENTS

2005/0180227 A1* 8/2005 Kitajima .................. 365/189.09
2006/0152976 A1* 7/2006 Lee ............................ 365/185.12
2007/0195609 A1* 8/2007 Kim et al. ................. 365/185.29

FOREIGN PATENT DOCUMENTS

KR    1020060095655    9/2006

OTHER PUBLICATIONS

Notice of Preliminary Rejection issued from Korean Intellectual Property Office on Nov. 11, 2010.
Kenichi Imamiya et al., "A 130mm2 256Mb NAND Flash with Shallow Trench Isolation Technology,".
IEEE International Solid-State Circuits Conference, Feb. 1999, San Francisco, CA, USA.

* cited by examiner

*Primary Examiner* — Jason Lappas
(74) *Attorney, Agent, or Firm* — IP & T Group LLP

(57) ABSTRACT

A nonvolatile memory device includes a memory cell array configured to comprise a number of cell strings, a number of page buffers each coupled to the cell strings of the memory cell array through bit lines, and a bit line precharge circuit configured to precharge a selected bit line up to a voltage of a first level before one of the page buffers precharges the selected bit line.

11 Claims, 3 Drawing Sheets

CIRCUIT FOR PRECHARGING BIT LINE AND NONVOLATILE MEMORY DEVICE INCLUDING THE SAME

CROSS-REFERENCE TO RELATED APPLICATION

Priority to Korean patent application number 1.0-2009-0047822 filed on May 29, 2009, the entire disclosure of which is incorporated by reference herein, is claimed.

BACKGROUND

Exemplary embodiments relate to a nonvolatile memory device and, more particularly, to a bit line precharge circuit and a nonvolatile memory device including the same.

In a known semiconductor circuit or a known memory device, current consumption may sharply increase in a specific operation. For example, in the refresh operation of DRAM and in the precharge operation of a nonvolatile memory device, current consumption can sharply increase. The nonvolatile memory device is described below as an example.

To write data into a memory cell of the nonvolatile memory device, a program operation is performed. The program operation may be performed by supplying a program pulse to the memory cell according to an incremental step pulse program (ISPP) method, and a verification operation may be performed for every pulse by checking whether the memory cell has been programmed. If, as a result of the check, the memory cell has been programmed, the memory cell is treated as being a program pass. However, if, as a result of the check, the memory cell has not been programmed, a next program pulse is supplied to the memory cell.

Such a verification operation can be classified into a bit line precharge period, an evaluation period, and a sense period. In the bit line precharge period, a lot of current consumption is generated because all bit lines have to be precharged. Thus, a drop in power results because of a peak current. Such a drop in power influences the overall operation of the nonvolatile memory device, which has an effect on an internal clock thereby potentially causing trouble.

As described above, in the known nonvolatile memory device, a large amount of current may be consumed when a lot of bit lines are precharged at the same time. Accordingly, a drop in power may result thereby negatively affecting the operation of the known nonvolatile memory device.

BRIEF SUMMARY

Exemplary embodiments relate to a bit line precharge circuit and a nonvolatile memory device including the same, which are capable of preventing a sharp drop in power when the bit line of the nonvolatile memory device is precharged.

A nonvolatile memory device according to an aspect of the present disclosure includes a memory cell array configured to include a number of cell strings, a number of page buffers each coupled to the cell strings of the memory cell array through bit lines, and a bit line precharge circuit configured to precharge a selected bit line up to a voltage of a first level before one of the page buffers precharges the selected bit line.

The bit line precharge circuit may precharge the selected bit line up to the voltage of the first level using charges charged by an external voltage.

The bit line precharge circuit may include an external voltage supply unit configured to supply the external voltage, a charge supply unit charged to the external voltage supplied by the external voltage supply unit, and a bit line coupling unit configured to couple the charge supply unit and the selected bit line together.

The external voltage supply unit may include a first NMOS transistor coupled between the external voltage terminal and the bit line coupling unit, and the first NMOS transistor may have a gate supplied with a first control signal.

The bit line coupling unit may include a second NMOS transistor coupled between the charge supply unit and the selected bit line, and the second NMOS transistor may have a gate supplied with a second control signal.

The charge supply unit may include a capacitor coupled between the external voltage supply unit and a ground terminal.

The bit line precharge circuit may include a number of charge supply units each charged to the external voltage supplied by the external voltage supply unit, and each coupled to the bit lines. Further, the external voltage supply unit may supply the external voltage, such that a number of the charge supply units are sequentially charged.

The number of the charge supply units may be classified into one or more groups of the charge supply units. The external voltage supply unit may be configured to supply the external voltage, such that the groups of the charge supply units are sequentially charged.

A circuit for precharging a bit line according to another aspect of the present disclosure includes an external voltage supply unit configured to supply an external voltage, a charge supply unit charged to the external voltage supplied by the external voltage supply unit, and a bit line coupling unit configured to couple the charge supply unit and a bit line together.

The external voltage supply unit may include a first NMOS transistor coupled between the external voltage terminal and the bit line coupling unit, and the first NMOS transistor may have a gate supplied with a first control signal.

The bit line coupling unit may include a second NMOS transistor coupled between the charge supply unit and the selected bit line, and the second NMOS transistor may have a gate supplied with a second control signal.

The charge supply unit may include a capacitor coupled between the external voltage supply unit and a ground terminal.

The bit line precharge circuit may include a number of charge supply units each charged to the external voltage supplied by the external voltage supply unit, and each coupled to the bit lines. Further, the external voltage supply unit may supply the external voltage, such that the charge supply units are sequentially charged.

DESCRIPTION OF EMBODIMENTS

Hereinafter, exemplary embodiments of the present disclosure will be described in detail with reference to the accompanying drawings. The figures are provided to allow those having ordinary skill in the art to understand the scope of the embodiments of the disclosure.

Figure 1:
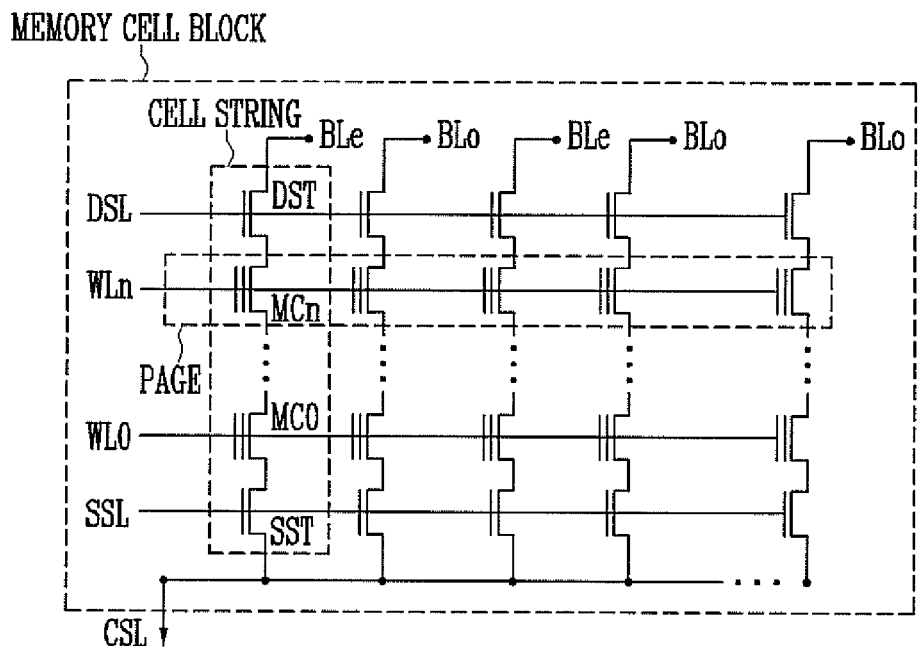
FIG. 1 is a diagram illustrating the configuration of the memory cell array of a nonvolatile memory device.

FIG. 1 is a diagram illustrating the configuration of the memory cell array of a nonvolatile memory device.

Although the memory cell array may include a number of memory cell blocks, only one memory cell block is illustrated in FIG. 1 for convenience of description.

Where the memory cell array includes a number of the memory cell blocks, each of the memory cell blocks includes a number of cell strings each coupled to a bit line BLe or BLo, and the memory cell blocks are coupled in parallel to a common source line CSL. Each of the cell strings includes memory cells MC0 to MCn for storing data, a drain select transistor DST coupled between the bit lines BLe or BLo and the memory cells MC0 to MCn, and a source select transistor SST coupled between the memory cells MC0 to MCn and the common source line CSL. The gates of the drain select transistors DST are interconnected to form a drain selection line DSL, the gates of the source select transistors SST are interconnected to form a source selection line SSL, and the gates of the memory cells MC0 to MCn are interconnected to form respective word lines WL0 to WLn. As shown in FIG. 1, each of the word lines is also called a page. Furthermore, an even bit line BLe and an odd bit line BLo are alternately coupled to the cell strings.

Figure 2:
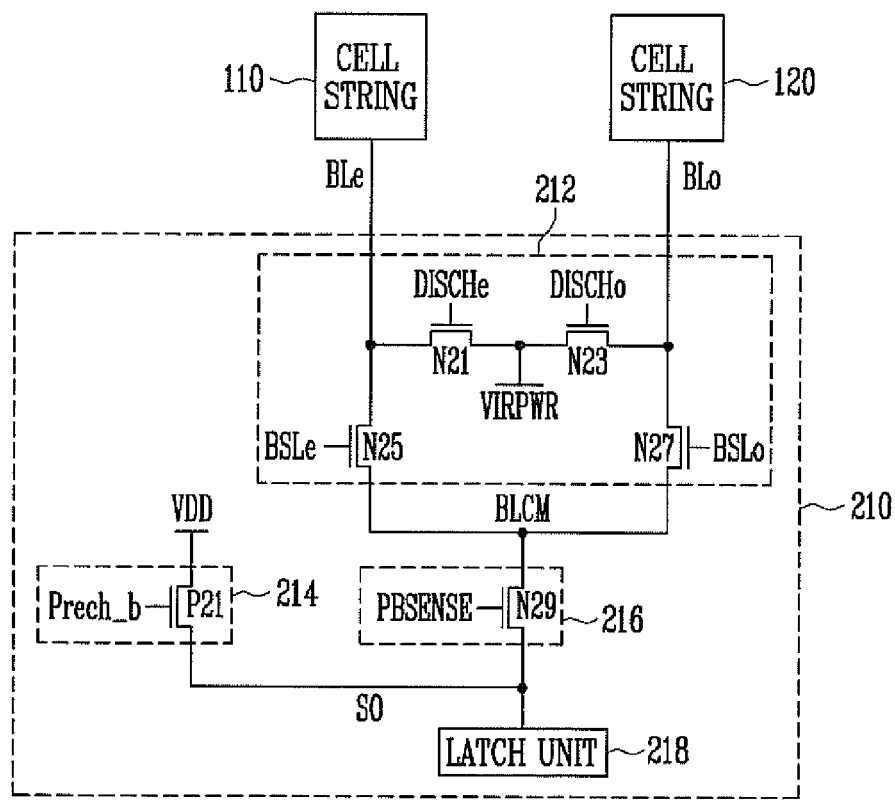
FIG. 2 is a circuit diagram of a page buffer of the nonvolatile memory device.

FIG. 2 is a circuit diagram of a page buffer of the nonvolatile memory device.

Referring to FIG. 2, the page buffer 210 is coupled to cell strings 110 and 120 (which are configured as shown in FIG. 1) through respective bit lines BLe and BLo. Further, the page buffer 210 is configured to program data into a specific memory cell, and to read data stored in a specific memory cell.

The page buffer 210 includes a bit line selection unit 212, a sense node precharge unit 214, a bit line sense unit 216, and a data latch unit 218. The bit line selection unit 212 is configured to selectively couple a bit line common node BLCM to the bit line BLe or BLo coupled to a selected memory cell. The sense node precharge unit 214 is configured to supply a sense node SO with a power source voltage VDD of a high level. The bit line sense unit 216 is configured to transfer a voltage level of the bit line BLe or BLo to the sense node SO according to a state of the selected memory cell during a verification or read operation. The data latch unit 218 is configured to temporarily store data to be programmed into the selected memory cell or to temporarily store data read from a specific cell.

The bit line selection unit 212 includes an NMOS transistor N25 configured to couple the even bit line BLe and the sense node SO together in response to a first bit line selection signal BSLe, and an NMOS transistor N27 configured to couple the odd bit line BLo and the sense node SO together in response to a second bit line selection signal BSLo. The bit line selection unit 212 further includes a variable voltage terminal configured to supply a variable voltage VIRPWR of a specific level, an NMOS transistor N21 configured to couple the even bit line BLe and the variable voltage terminal in response to a first discharge signal DISCHe, and an NMOS transistor N23 configured to couple the odd bit line no and the variable voltage terminal in response to a second discharge signal DISCHo. Meanwhile, in exemplary embodiments, the bit line sense unit 216 can be omitted from the page buffer 210. In this case, the NMOS transistors N25 and N27 can play the role of the bit line sense unit 216.

The sense node precharge unit 214 is configured to supply the sense node SO with a power source voltage VDD of a high level in response to a precharge signal Prech_b. To this end, the sense node precharge unit 214 includes a PMOS transistor P21 coupled between the sense node SO and a terminal for supplying the power source voltage VDD. Accordingly, the sense node precharge unit 214 supplies the sense node SO with the power source voltage VDD of a high level in response to the precharge signal Prech_b of a low logic level.

The bit line sense unit 216 includes an NMOS transistor N29 coupled between the bit line selection unit 212 and the sense node SO. The bit line sense unit 216 is configured to couple the bit line common node BLCM and the sense node SO together in response to a bit line sense signal PBSENSE of a high logic level, in order to evaluate the voltage level of a specific bit line, such that the voltage level of data stored in a specific memory cell coupled to the specific bit line is supplied to the sense node SO. That is, a read or verification operation is performed in response to a voltage level of the bit line sense signal PBSENSE supplied to the gate of the NMOS transistor N29.

The data latch unit 218 is configured to temporarily store data to be programmed into a specific memory cell, or to temporarily store data read from a specific cell.

The page buffer 210 shown in FIG. 2 is only illustrative in order to describe various operations performed by a typical page buffer. It is evident to those skilled in the art that the page buffer 210 can be modified in various ways. For example, as known in the art, the page buffer can include a plurality of the data latch units 218.

Figure 3:
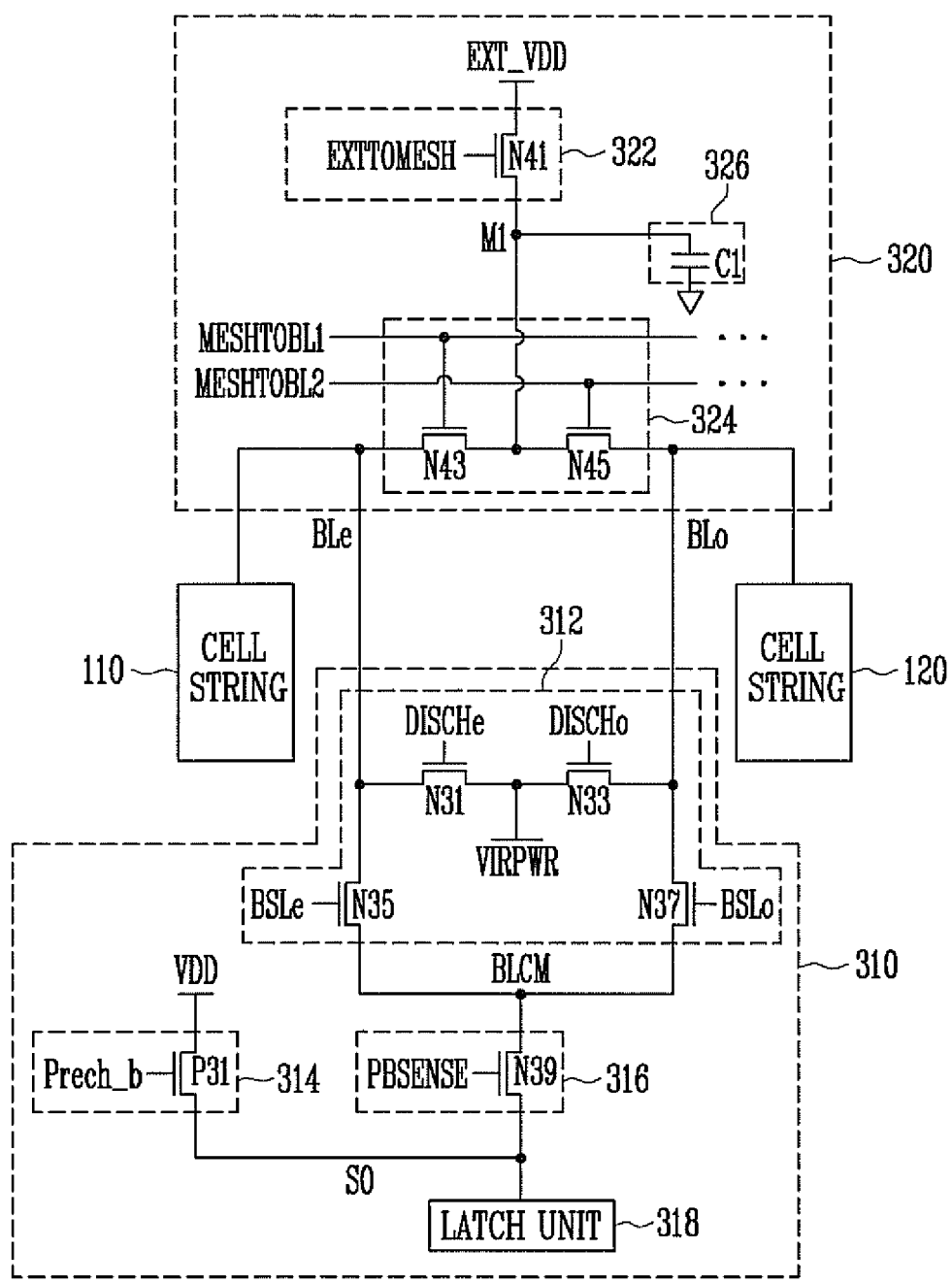
FIG. 3 is a circuit diagram of a nonvolatile memory device according to an embodiment of the present disclosure.

FIG. 3 is a circuit diagram of a nonvolatile memory device according to an embodiment of the present disclosure.

Referring to FIG. 3, the nonvolatile memory device includes a memory cell array configured to include a number of cell strings 110 and 120, a page buffer 310 coupled to the cell strings of the memory cell array through bit lines BLe and no, and a bit line precharge circuit 320 configured to precharge the bit lines BLe and BLo.

The page buffer 310 is coupled to the cell strings 110 and 120, each including a number of memory cells, through the bit lines BLe and no. The page buffer 310 is configured to program data into a specific memory cell, or read data stored in a specific memory cell.

The page buffer 310 includes a bit line selection unit 312, a sense node precharge unit 314, a bit line sense unit 316, and a data latch unit 318.

The page buffer 310 shown in FIG. 3 has the same construction as the page buffer 210 shown in FIG. 2. Further, the elements of the page buffer 210 have been described above, and thus, a description of the elements of the page buffer 310 is omitted.

The bit line precharge circuit 320 is configured to precharge the bit line BLe or no up to a voltage of a first level, before the page buffer 310 precharges the bit line BLe or BLo to a target voltage level during a read operation or a program verification operation. In other words, before the page buffer 310 performs an operation for precharging the bit line, the bit line precharge circuit 320 precharges the bit line up to the voltage of a first level. In exemplary embodiments of the present disclosure, the bit line precharge circuit 320 can precharge the bit line up to the voltage of a first level using electric charges charged by an external voltage.

The bit line precharge circuit 320 includes an external voltage supply unit 322, a bit line coupling unit 324, and a charge supply unit 326.

The external voltage supply unit 322 is configured to supply an external voltage EXT_VDD to the charge supply unit 326. To this end, the external voltage supply unit 322 includes an NMOS transistor N41 coupled between a first node M1 and a terminal for supplying the external voltage EXT_VDD. A control signal EXTTOMESH is inputted to the gate of the NMOS transistor N41.

The charge supply unit 326 is charged to the external voltage EXT_VDD supplied by the external voltage supply unit 322. To this end, the charge supply unit 326 includes a capacitor C1 coupled between the first node M1 and a ground terminal.

The bit line coupling unit 324 is configured to couple the charge supply unit 326 and the bit lines BLe and BLo together. More specifically, the bit line coupling unit 324 is configured such that the bit lines BLe and BLo are precharged to the charges stored in the charge supply unit 326. To this end, the bit line coupling unit 324 includes an NMOS transistor N43 configured to couple the charge supply unit 326 and the even bit line BLe together and an NMOS transistor N45 configured to couple the charge supply unit 326 and the odd bit line BLo together. Control signals MESHTOBL1 and MESHTOBL2 are respectively coupled to the gates of the NMOS transistors N43 and N45, which are coupled between the first node M1, and the bit lines BLe and BLo.

It is noted that, although only one page buffer 310 is illustrated in FIG. 3, an actual nonvolatile memory device may include a number of page buffers each coupled to a pair of even and odd bit lines. Accordingly, in the present disclosure, the nonvolatile memory device includes a number of the bit line precharge circuits 320 each coupled to a pair of bit lines BLe and BLo. Further, each of the bit line precharge circuits 320 includes the external voltage supply unit 322, the bit line coupling unit 324, and the charge supply unit 326. Here, the external voltage supply units 322 can supply the external voltages EXT_VDD to the respective charge supply units 326 in response to the respective control signals EXTTOMESH, such that the charge supply units 326 are sequentially charged. Also, in exemplary embodiments of the present disclosure, a number of the charge supply units 326 can be classified into one or more groups, and the external voltage supply units 322 can supply the external voltages EXT_VDD to the respective groups of charge supply units 326 in response to the respective control signals EXTTOMESH, such that the groups of charge supply units 326 are sequentially charged.

A method of operating the nonvolatile memory device according to an exemplary embodiment is described below.

Figure 4:
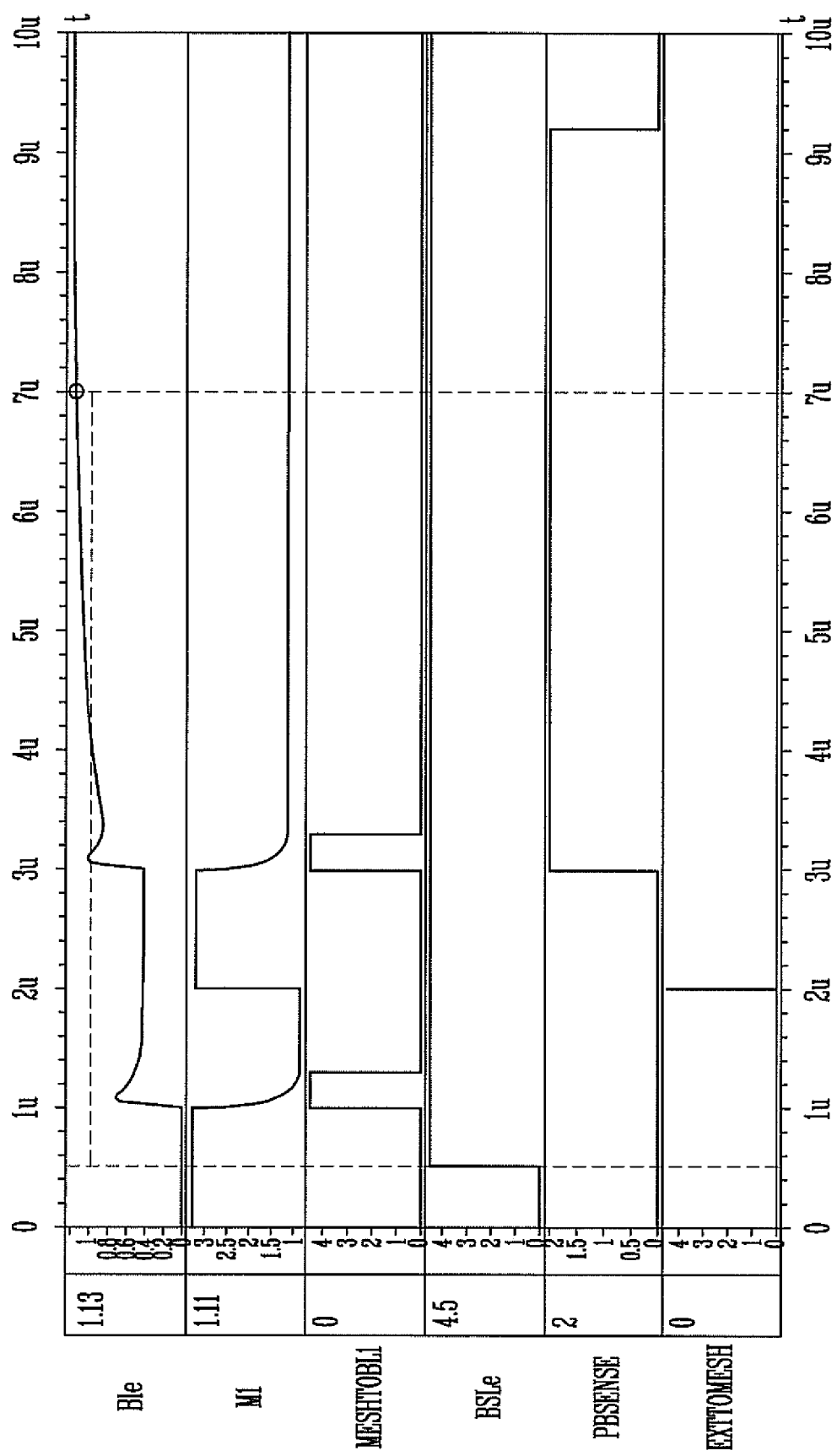
FIG. 4 is a timing diagram illustrating the nonvolatile memory device according to an embodiment of the present disclosure.

FIG. 4 is a timing diagram illustrating the nonvolatile memory device according to an embodiment of the present disclosure. Signal waveforms shown in FIG. 4 belong to the nonvolatile memory device shown in FIG. 3 when a precharge operation for a read operation or a verification operation is performed.

Referring to FIGS. 3 and 4, the first node M1 is initially in a precharge state. When the signal BSLe of a high level is received, the NMOS transistor N35 is turned on, and so the bit line BLe is selected. At this time, the signal PBSENSE remains in a low logic level, and so the NMOS transistor N39 remains turned off.

When the time 't' becomes 1μ (where μ represents one unit of time), the level of the control signal MESHTOBL1 shifts to a high level, and so the NMOS transistor N43 is turned on. While the control signal MESHTOBL1 remains in a high level for a certain period of time, charges precharged in the first node M1 are discharged toward the bit line BLe. After a lapse of time, the charges of the first node M1 are all discharged, and so the bit line BLe is precharged up to a voltage of a first level.

Next, the control signal MESHTOBL1 shifts from a high logic level to a low logic level, and so the NMOS transistor N43 is turned off. Accordingly, the connection between the bit line BLe and the first node M1 is disconnected, and the external voltage supply unit 322 is prepared to charge the first node M1 in response to the control signal EXTTOMESH.

When the time 't' becomes 2μ, the control signal EXTTOMESH of a high logic level is instantly received, and the NMOS transistor N41 is turned on. At this time, the external voltage EXT_VDD is supplied to the first node M1. Accordingly, the charge supply unit 326 is precharged to the supplied external voltage EXT_VDD again.

When the time 't' becomes 3μ, the signal PBSENSE shifts to a high logic level, the NMOS transistor N39 is turned on, and so the bit line BLe starts being precharged to the charges of the sense node SO. In this manner, the bit line BLe is precharged from the voltage of a first level up to voltage of a target level. In this case, while the control signal MESHTOBL1 remains in a high level for a certain period of time, the bit line BLe is precharged to the charges precharged in the first node M1. As described above, when the bit line BLe is precharged by the page buffer 310 in a read operation or a verification operation, the bit line precharge circuit 320 additionally supplies a precharge voltage. Accordingly, since the page buffer 310 only has to be precharged with a small amount of charges, a phenomenon in which a large amount of current is instantly consumed can be prevented.

As described above, according to the present disclosure, when a bit line is precharged, the bit line is previously precharged up to a specific level. Thus, a phenomenon in which a large amount of current is instantly generated when a number of bit lines are precharged at the same time can be prevented. Accordingly, a drop of power resulting from a sharp increase of current can be prevented, and the characteristic of a nonvolatile memory device can be improved.

What is claimed is:

1. A nonvolatile memory device, comprising:
   a memory cell array configured to comprise a number of cell strings;
   a number of page buffers coupled to the cell strings of the memory cell array through bit lines; and
   a bit line precharge circuit configured to precharge selected bit lines up to a voltage of a first level before one of the page buffers precharges the selected bit lines up to a voltage of a second level,
   wherein the bit line precharge circuit comprises:
   external voltage supply unit configured to supply an external voltage;
   charge supply units charged to the external voltage supplied by the external voltage supply units; and
   bit line coupling units configured to couple the charge supply units and the selected bit lines together,
   wherein the external voltage supply units supply the external voltage to the charge supply units such that the charge supply units are sequentially charged.

2. The nonvolatile memory device of claim 1, wherein the bit line precharge circuit precharges the selected bit lines up to the voltage of the first level using charges charged by the external voltage.

3. The nonvolatile memory device of claim 1, wherein the external voltage supply units comprise first NMOS transistors coupled between the external voltage terminal and the bit line coupling, and each of the first NMOS transistors has a gate supplied with a first control signal.

4. The nonvolatile memory device of claim 1, wherein the bit line coupling units comprises second NMOS transistors coupled between the charge supply units and the selected bit lines and each of the second NMOS transistors has a gate supplied with a second control signal.

5. The nonvolatile memory device of claim 1, wherein the charge supply units comprise capacitors coupled between the external voltage supply units and a ground terminal.

6. The nonvolatile memory device of claim 1, wherein: the charge supply units are classified into one or more groups of the charge supply units, and the external voltage supply units are configured to supply the external voltage, such that the groups of the charge supply units are sequentially charged.

7. A circuit for precharging bit lines, comprising:
external voltage supply units configured to supply an external voltage;
charge supply units charged to the external voltage supplied by the external voltage supply units; and
bit line coupling units configured to couple the charge supply units and the bit lines together to charge the bit lines up to a voltage of a first level before page buffers precharges the bit lines up to a voltage of a second level
wherein external voltage supply units supply the external voltage to the charge supply units such that the charge supply units are sequentially charged.

8. The circuit of claim 7, wherein the external voltage supply units comprise first NMOS transistors coupled between the external voltage terminal and the bit line coupling units, and each of the first NMOS transistors has a gate supplied with a first control signal.

9. The circuit of claim 7, wherein the bit line coupling units comprise second NMOS transistor coupled between the charge supply units and the bit lines, and each of the second NMOS transistors has a gate supplied with a second control signal.

10. The circuit of claim 7, wherein the charge supply units comprise capacitors coupled between the external voltage supply units and a ground terminal.

11. The circuit of claim 7, wherein: the charge supply units are classified into one or more groups of the charge supply units, and the external voltage supply units are configured to supply the external voltage, such that the groups of the charge supply units are sequentially charged.

* * * * *